United States Patent
Wilcock et al.

(10) Patent No.: US 10,148,051 B2
(45) Date of Patent: Dec. 4, 2018

(54) MODULAR ELECTRONIC STRUCTURES

(71) Applicant: UNIVERSITY OF SOUTHAMPTON, Hampshire (GB)

(72) Inventors: Reuben Wilcock, Hampshire (GB); Thomas Redman, Hampshire (GB)

(73) Assignee: University of Southampton, Research and Innovation Services, Hampshire (GB)

( * ) Notice: Subject to any disclaimer, the term of this patent is extended or adjusted under 35 U.S.C. 154(b) by 0 days.

(21) Appl. No.: 15/388,456

(22) Filed: Dec. 22, 2016

(65) Prior Publication Data

US 2017/0187156 A1    Jun. 29, 2017

(30) Foreign Application Priority Data

Dec. 23, 2015  (GB) .................................. 1522784.6

(51) Int. Cl.
*F21Y 107/20* (2016.01)
*H01R 33/945* (2006.01)
(Continued)

(52) U.S. Cl.
CPC ............ *H01R 33/9453* (2013.01); *F21S 2/00* (2013.01); *F21V 21/005* (2013.01); *H04N 5/2256* (2013.01); *H04N 5/247* (2013.01); *H05K 1/0313* (2013.01); *H05K 1/115* (2013.01); *H05K 1/142* (2013.01); *H05K 1/181* (2013.01); *F21Y 2107/20* (2016.08); *F21Y 2115/10* (2016.08); *H04N 5/2251* (2013.01); *H05K 2201/10106* (2013.01); *H05K 2201/10121* (2013.01); *H05K 2201/10151* (2013.01); *H05K 2201/10409* (2013.01)

(58) Field of Classification Search
CPC ........ F21S 2/00; F21S 4/00; F21S 4/15; F21S 4/20; F21S 4/22; F21S 4/28; F21S 4/24; F21V 21/005; F21Y 2107/20; F21Y 2115/10; H05K 1/142; H04N 5/2251; H04N 5/2256; H01R 33/9453
USPC ......................................................... 361/789
See application file for complete search history.

(56) References Cited

U.S. PATENT DOCUMENTS

| | | | | |
|---|---|---|---|---|
| 2,710,335 | A | * | 6/1955 | Wong ........................ F21V 3/00 181/289 |
| 4,893,223 | A | * | 1/1990 | Arnold ............... G01N 21/8806 257/E25.028 |

(Continued)

FOREIGN PATENT DOCUMENTS

| | | |
|---|---|---|
| WO | 2006/044859 A2 | 4/2006 |
| WO | 2010/088695 A1 | 8/2010 |
| WO | 2015/072849 A1 | 5/2015 |

*Primary Examiner* — Timothy Thompson
*Assistant Examiner* — Rhadames J Alonzo Miller
(74) *Attorney, Agent, or Firm* — Rosenberg, Klein & Lee

(57) ABSTRACT

A modular structural member (100) comprising: at least two connection portions (102), and a structural portion (101), the connection portions arranged to provide electrical and mechanical connection to other structural members, and wherein, electronic componentry (125) is provided on the structural portion, and/or the connection portions are arranged to receive a fastener (240; 260), to connect multiple connection portions together, which is provided with electronic componentry, and further wherein, a plurality of the structural members arranged to be connected together to form a structure.

35 Claims, 4 Drawing Sheets

(51) Int. Cl.
  *F21V 21/005*  (2006.01)
  *H04N 5/225*   (2006.01)
  *H04N 5/247*   (2006.01)
  *H05K 1/03*    (2006.01)
  *H05K 1/11*    (2006.01)
  *H05K 1/14*    (2006.01)
  *H05K 1/18*    (2006.01)
  *F21S 2/00*    (2016.01)
  *F21Y 115/10*  (2016.01)

(56) References Cited

U.S. PATENT DOCUMENTS

| | | | | |
|---|---|---|---|---|
| 5,084,804 | A * | 1/1992 | Schairer | F21S 48/215 257/E25.02 |
| 5,162,696 | A * | 11/1992 | Goodrich | G09F 9/33 257/E25.02 |
| 5,404,282 | A * | 4/1995 | Klinke | F21K 9/00 257/E25.028 |
| 6,161,941 | A * | 12/2000 | Tait | G01B 11/00 362/235 |
| 6,585,395 | B2 * | 7/2003 | Luk | F21V 14/02 362/249.02 |
| 6,598,994 | B1 * | 7/2003 | Tait | G01B 11/00 362/11 |
| 6,972,207 | B2 * | 12/2005 | Toyota | H05K 1/189 348/86 |
| 8,371,894 | B1 * | 2/2013 | Rosen | A63H 33/086 446/102 |
| D687,980 | S * | 8/2013 | Gravely | D26/2 |
| 8,540,397 | B2 * | 9/2013 | Gill | F21S 8/086 362/147 |
| 8,629,464 | B2 * | 1/2014 | Roberts | F21V 29/74 257/88 |
| 8,637,880 | B2 * | 1/2014 | Roberts | H01L 25/0753 257/88 |
| 8,707,551 | B2 * | 4/2014 | Amey | H05K 1/056 174/250 |
| 8,967,838 | B1 * | 3/2015 | Miller | F21K 9/233 362/239 |
| 9,016,902 | B1 * | 4/2015 | Lin | F21S 2/005 362/249.01 |
| 9,587,807 | B2 * | 3/2017 | Togawa | G01N 21/8806 |
| 2006/0134978 | A1 * | 6/2006 | Rosen | A63H 33/042 439/581 |
| 2010/0045189 | A1 * | 2/2010 | Storch | H01L 51/50 315/149 |
| 2010/0046210 | A1 * | 2/2010 | Mathai | H01L 51/52 362/147 |
| 2010/0197148 | A1 * | 8/2010 | Rudisill | H01R 11/30 439/40 |
| 2012/0106153 | A1 * | 5/2012 | Huang | F21K 9/232 362/249.02 |
| 2012/0250297 | A1 * | 10/2012 | Higgins | F21V 29/83 362/158 |
| 2013/0240920 | A1 * | 9/2013 | Lin | F21K 9/232 257/89 |
| 2014/0313719 | A1 * | 10/2014 | Wang | F21V 17/002 362/242 |
| 2015/0176772 | A1 * | 6/2015 | Martins | F21K 9/20 362/249.02 |

* cited by examiner

MODULAR ELECTRONIC STRUCTURES

TECHNICAL FIELD

The invention relates generally to modular structural members arranged to be connected together to create a structure.

BACKGROUND

It can be desirable to create a two dimensional or three dimensional physical structure or framework which includes distributed electronic functionality. For example, this could be a large spherical or hemi-spherical structure which contains a number of controllable lights, sensors, cameras or other electronic input/output devices. One such application is a dome structure which contains controllable high powered light emitting diodes (LEDs) on its inwardly facing surface to allow an object contained within the dome to be photographed whilst illuminated from one, some or all of a plurality of different directions/angles. Another such application includes a (large) substantially spherical structure which comprises high powered controllable LEDs on its outwardly facing surface and is used as a decorative lighting feature in a home or retail space. A further such application is a ring-like structure which is provided with a plurality of miniature cameras facing outwards from its surface in order to capture photos through 360 degrees. A further application is a two-dimensional arrangement of narrow beam proximity sensors mounted to a ceiling which allows objects moving below it to be tracked.

We have devised an improved solution to enable such structures to be realised.

SUMMARY

According to a first aspect of the invention, there is provided a modular structural member comprising: at least two connection portions, and a structural portion, the connection portions arranged to provide electrical and mechanical connection to other structural members, and wherein, electronic componentry is provided on the structural portion, and/or the connection portions are arranged to receive a fastener, to connect multiple connection portions together, which is provided with electronic componentry, and further wherein, a plurality of the structural members arranged to be connected together to form a structure.

The member preferably has a structural integrity to allow multiple members to be connected together into a structure, which may be considered as a framework. More generally, a plurality of the members arranged to be connected together to form a desired structure.

The member may be considered as a module or an electronic module.

The member may be arranged to be detachably connected to another member.

Members may be arranged to be attached together by way of a fastener or fixing. End portions of members may be arranged to be maintained in a connected condition by way of being clamped by the fixing/fastener.

The fixing/fastener may comprise a threaded shank, and opposing clamping surfaces.

Embodiments of the invention may be viewed as achieving two key objectives. The first is the ability to create a two- or three-dimensional physical structure. The second is electrical interconnection of the lights, sensors, cameras or whichever electronic input/output devices are provided for both power and, preferably, data communication purposes. In one embodiment of the present invention there is provided modular structural member which highly advantageously addresses both the structural requirements and the electrical connection requirements in a reliable form which can be produced at low cost, and are easily assembled, disassembled and transported. A plurality of the members can be interconnected to form larger structures, in a required configuration or shape.

The electronic componentry may comprise one or more electronic sub-assemblies, or an electronic device.

The electronic componentry may be mounted on one or more surfaces of the member. The electronic componentry may be surface-mounted on the member.

The electronic componentry may comprise one or more (electronic) input or output devices.

The electronic componentry may be arranged to emit or receive electromagnetic radiation. The electronic componentry may comprise a light emitter, such as an LED. The electronic componentry may comprise a sensor to detect and/or record electromagnetic radiation impinging on the sensor. The electronic componentry may comprise a pixelated sensor and/or an optical lens. The electronic componentry may comprise a motion sensor. The electronic componentry may comprise a data processor and/or a memory. The electronic componentry may comprise a signal processor.

The electronic componentry may have an area footprint which substantially does not exceed or extend beyond, or is substantially contained within, the footprint extent of the underlying support surface of the member to which the componentry is attached.

The intermediate region may be substantially central of the first and second connection portions.

Each of the connection portions may be provided with a through-hole. The through-hole may be arranged to receive a fastener or fixing arranged to hold a plurality of members together in an attached condition.

The through-hole may be provided substantially centrally of a respective connection portion.

Each connection portion may comprise at least one electrical contact (or terminal, or connector). The electrical contact may be of substantially arcuate shape. The electrical contact may be substantially circular. In some embodiments, all connection portions comprise at least one electrical contact. In other embodiments, only one or some of the connection portions comprise at least one electrical contact. For example, those connection portions which are not provided with an electrical contact may serve purely for mechanical connection.

One or more circular electrically conductive rings may be provided at the ends of the module thereby allowing the electrical connection to one or more adjacent members.

In the case of more than one circular conducting ring, the rings may be arranged concentrically, thereby allowing a number of members to be joined at different relative orientations or angles, whilst still ensuring reliable connection. In the case where more than two modules are connected at a single point or node, electrical contact rings may be provided on both the top and bottom surfaces of the substrate of the member with these rings connected together through the substrate using features such as through-hole vias. In this way any number of members can be connected together at a connection point and allows the electrical signals to be shared between all connected members.

A hole may be formed at the centre of the concentric contact rings to ensure correct alignment of the adjacent members (and in particular their electrical contacts) in a connected condition. The use of a mechanical fixing through the holes in all members at a connection point ensures that regardless of the orientation of the adjacent members, the concentric rings are in register and electrical connection successfully achieved. Using such a fixing conveniently also performs the mechanical connection of adjacent members, preventing the need for additional fixings. The fixing is arranged in such a way as to make assembly of the overall structure simple and efficient without the need for special tools. The fixing is such that a stack of connected portions is clamped and mechanically compressed in an even fashion, ensuring reliable electrical connection over all concentric contact rings.

The, or each, electrical contact may be provided on at least one side of the member. Preferably, a counterpart electrical contact is provided on the opposite side of the member. The (pair of) electrical contacts may be connected together. The electrical contacts may be connected together by way of an electrically-plated through-hole provided in a substrate of the member.

The, or each, electrical contact may be externally or outwardly facing, and may be termed as an external contact. An electrical contact of one member may be arranged to be brought into electrical contact with a contact of another member by way of face-to-face interconnection or direct contact.

Each of the connection portions may comprise a plurality of electrical contacts on one side of the member, which are spaced-apart and electrically isolated from each other.

At least one of the connection portions may comprise an electrical contact connected by circuitry to the electronic componentry. Preferably, both of the connection portions may comprise an electrical contact which electrically connects to the electronic componentry.

The member may be arranged to achieve electrical interconnectivity between a plurality of connected members.

The, or each, electrical contact may be arranged to carry at least one of data, power and/or signalling.

The, or each, electrical contact may be fabricated onto a substrate surface of the member.

Each of the connection portions may be arranged to be connected to a connection portion of another member in a stack formation.

The member may comprise a substrate. The substrate may be of substantially overall planar form.

The substrate may be formed or comprise a layer of cured polymer, such as a glass epoxy, for example of the FR-4 type, or Polyimide. The member may comprise a printed circuit board (PCB) substrate. The substrate material is preferably electrically insulative.

The member may comprise (an essentially) single-layered substrate. The substrate may be viewed as a single layer of substrate material. However, the member may comprise a multi-layered substrate.

The member may be of overall substantially elongate form. A principal length dimension of the member may be greater than a principal width dimension.

A portion intermediate of the connection portions may comprise a substantially straight portion. The intermediate portion may comprise a bulbous or enlarged portion. The enlarged or bulbous portion may be located substantially centrally of the member. The enlarged or bulbous portion may be located intermediate of two portions of narrower profile, which may be substantially straight.

The connection portions may be of a substantially rounded profile (when viewed in plan). The connection portions may be substantially planar.

Embodiments of the :invention may comprise one or more limbs with a connection portion provided at the or each distal end of the limb(s).

The member may comprise one or more electrically conductive pathways comprising tracks and/or pads integral with a non-conductive substrate. The member may comprise circuitry embedded or integrated with a substrate of the member. This circuitry or pathway may comprise a metallic foil.

It will be appreciated that the shape of the electronic substrate may be designed in accordance with one or more structural or configurational requirements of the (larger) structure to be created from multiple members. In particular, but not exclusively, the member may be of long, elongate or narrow form which is arranged to allow a sufficient degree of flexure, such as being semi-rigid, so that a curved surface can be achieved when in situ connected to other members. The member may be fully flexible, to allow very complex surface shapes to be achieved. Alternatively, flexi-rigid materials may be used, which comprise a hybrid of a flexible plastic material, to achieve sharp angles at the regions required, whilst ensuring structural rigidity between those regions as well as a harder, more rigid material with a surface suitable for the mounting of electronic components.

One embodiment of the invention comprises a specially shaped rigid, flexible or flexi-rigid substrate whose purpose is two-fold. A first objective is to allow electronic componentry such as lights, sensors, cameras or other electronic input/output devices, along with further electronic components required for their control, to be connected in the form of an electronic circuit. A second objective of the substrate is to serve as a mechanical element within the overall physical structure. Solving the electronic and mechanical requirements of the overall physical structure through use of a single-layered substrate advantageously reduces complexity, the number of manufacturing steps and cost.

It will be appreciated that varied physical structures can be constructed from the interconnection of multiple individual members. For example, a cubic shape can be constructed from twelve lengths forming its vertices and a spherical shape can be constructed from lengths connected in a geodesic arrangement. More complex shapes can be formed by joining triangles of different sizes to create a mesh, which is a process regularly used in the digitisation of characters in the computer games and film industries and to represent complex surfaces within computer aided design software.

It will be appreciated that various approaches may be employed to control the electronic componentry provided on the member. One possible approach would be to produce a member which in use serves as a master to control a subset, or all of, the other members that form the overall structure. Alternatively, a circular electrical connector on one of the end portions may be connected to separate control electronics using a wire or cable. A further approach could be that the individual electronic modules operate substantially autonomously to control their functionality. Yet a further approach could be that the electronic modules or componentry include a wireless or air-interface through which they can be controlled externally.

Additional electronic componentry may be located at or adjacent to a connection portion. This may be achieved by way of a fixing, for attaching the end portions together, being provided with the additional electronic componentry.

In situ, the additional electronic componentry, when viewed in plan, may be contained substantially within the footprint of an end portion.

According to a second aspect of the invention there is provided apparatus comprising a plurality of modular structural members of the first aspect of the invention, and at least one fixing to enable the end portions of members to be connected together.

According to a third aspect of the invention there is provided a structure comprising a plurality of connected modular structural members of the first aspect of the invention. Connection portions of the members may be viewed as nodes of the structure.

The first aspect, the second aspect and/or the third aspect may comprise one or more features included in the detailed description and/or as shown in the drawings, individually or in combination with any of the features above.

BRIEF DESCRIPTION OF THE DRAWINGS

Various examples of the invention, will now be described, by way of example only, with reference to the following drawings in which.

DETAILED DESCRIPTION

Figure 1:
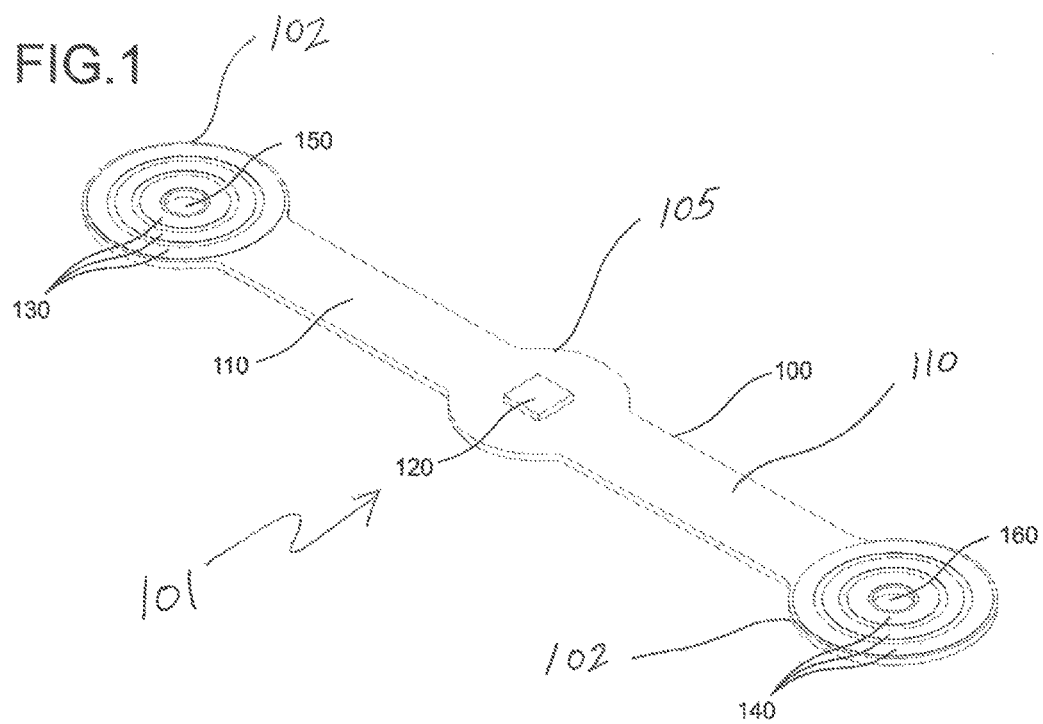
FIG. 1 is a perspective view of a modular structural member in a first orientation.
Figure 2:
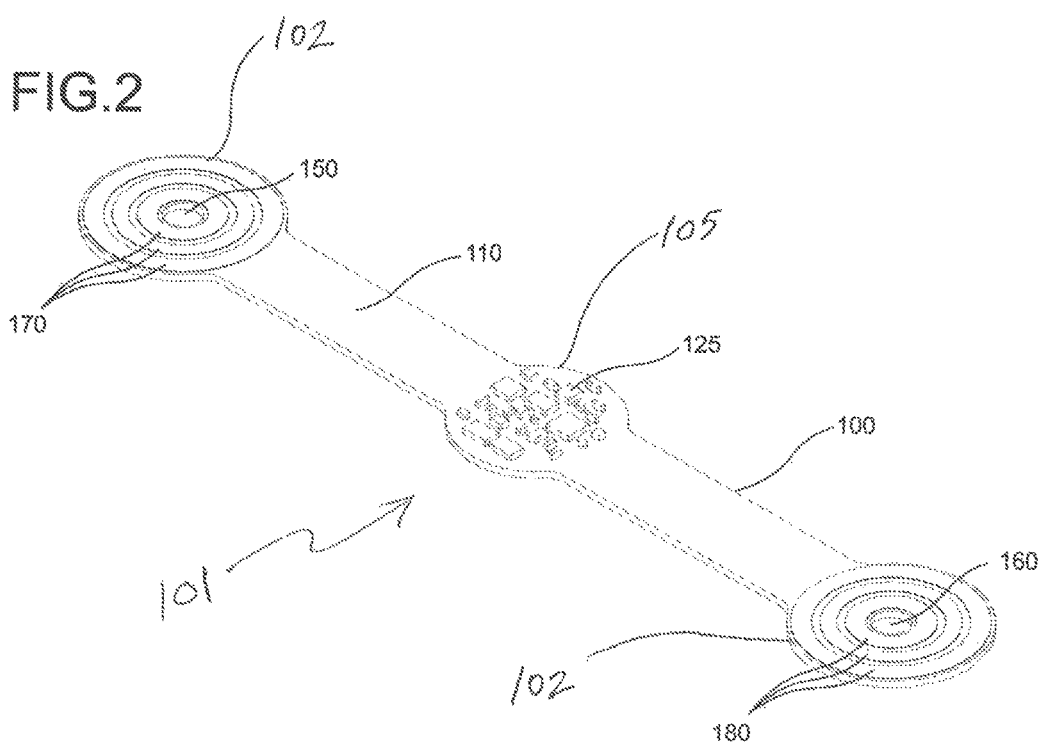
FIG. 2 is a perspective view of the member of FIG. 1 in a second orientation.

Reference is first made to FIGS. 1 and 2 which show a modular structural member 100. In overview, the member, 100, comprises an electronics mounting substrate, 110, which is made from a printed circuit board material, such as slightly flexible FR-4 material. On a surface of the substrate there is provided a high powered LED, 120, mounted centrally of the member 100. It will be appreciated that in different embodiments other electronic componentry such as sensors, cameras or other electronic input/output devices can mounted in place or in addition of the LED. As will be explained in detail below, a plurality of the members 100 can be connected together, so as to create an overall structure, which can be used for a multitude of purposes, depending on the configuration of the structure and/or the electronic components provided.

The member 100 comprises an intermediate portion 101 and two end portions 102. The intermediate portion may, in broad terms, be viewed as a structural member, and the end portions as connector portions. The intermediate portion, is located between the end portions. The end portions 102 form the distal extremities of the member 100. Each of the end portions 102 is of rounded shape.

The intermediate portion 101 comprises two substantially straight portions 110. The intermediate portion 101 further comprises a bulbous or enlarged portion 105, on which the LED 120, and the other electronic componentry 125 associated with the LED, is mounted. FIG. 2 illustrates the reverse side of the member of the current invention where the additional electronic components, 125, are placed. All of the electronic componentry lies within the footprint of the bulbous portion 105. The bulbous portion is flanked by the two straight portions 110.

Each distal end 102 of the member 100 comprises three concentric electrically conductive rings, provided on opposite sides of the member, and a respective aperture. Each set of rings is arranged to provide a number of electrical contacts. Specifically, one distal end comprises rings 130 and 170 (located on opposite sides of the member substrate), and an aperture, 150 and the other end comprises of a similar set of concentric rings, 140 and 180 (located on opposite sides of the member substrate), and a similar hole, 160. At each distal end, each ring on one side, is electrically connected to a counterpart ring on the opposite side. Specifically, each of the rings 130 has a counterpart ring from the set 170, located on the opposite side. The same applies to the rings 140 and 180 of the other distal end. The connection between counterpart rings is achieved by electrically plating each of through-holes in the member with respective conductive portions, to pair the rings together. For example, the radially outermost ring on one side is connected to the radially outermost ring on the opposite side.

Although not shown in the Figures, one or more electrical pathways or circuitry is provided, between at least one of each pair of rings, and the electronic componentry, extending along the portions 110. This may comprise an integral or embedded metallic foil or wire provided within the substrate of the member. These electrical pathways may conveniently carry one or more of power, data or (control) signalling between the rings and the electronic componentry.

The member 100 is of overall elongate shape.

Figure 3:
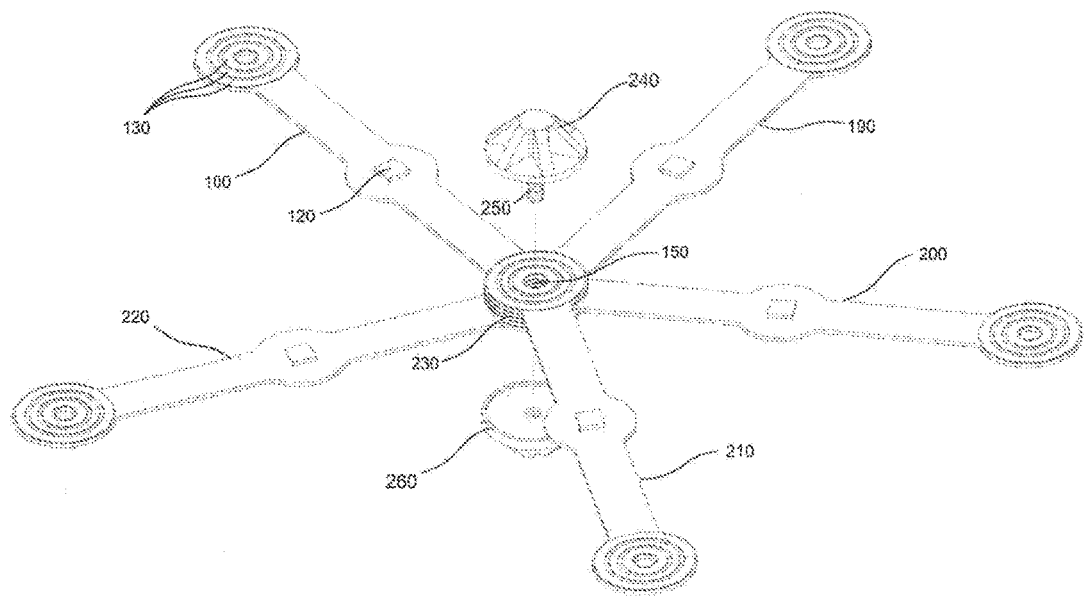
FIG. 3 is a perspective view of a plurality of modular structural members, arranged in a connected formation, and a fixing to maintain the members in an attached condition.

FIG. 3 illustrates how multiple modular structural members shown in FIGS. 1 and 2 can be connected mechanically and electrically to form a larger structure, as 'building blocks'. A plurality of modular structural members, 100, 190, 200, 210, 220 (all substantially identical) connect at a common point 230, such that all the through-holes 150, align at the respective distal end portions.

The members are held in a connected condition by way of a two-piece fastener. The fastener comprises two parts, 240 and 260, connected by a threaded shank, 250. Each of the parts 240 and 260 provides a clamping surface. Each part is arranged to be manually gripped, and counter rotated so as to apply a force to the end portions located between the parts. When fully tightened, the parts keep the end portions in a tightly clamped stack. Advantageously, the fastening ensures both physical connection and electrical connection through the contacts formed between the concentric rings. Advantageously, before the fastener is tightened, the two or more members may be set to a required orientation. Once set, and the fastener tightened, the members are maintained in that orientation. Advantageously, because of the circular shape of the rings, and because the fastener aligns the rings in a connected condition, the rings of adjacent end portions will always be in electrical contact regardless of relative orientation.

These concentric rings, 130, on both the top and bottom surfaces of the substrate of each module and are connected through the substrate by through-hole vias, achieved by way of plating the inner surface of the holes. For example, one pair of rings could be used to provide power to the LED. Another ring could be used to provide a control signal. If the electronic componentry includes a sensor, then data from the sensor could be sent through a respect ring pair. Connecting the members in this way allows for different circuits and sub-circuits to be created. For example, the members may be connected so as to create one or more power supply circuits, or sub-circuits, each supplying power to a respective group of LEDs.

In summary, the arrangement shown in FIG. 3 ensures that, in this embodiment, all connected modules have access to power and/or a data signal, which in turn allows the LEDs 120, to be powered and controlled externally.

It can be appreciated from FIG. 3 that further modules could be connected to the other (free) distal end portions of the members, again using one or more fasteners of the type described above.

Figure 4:
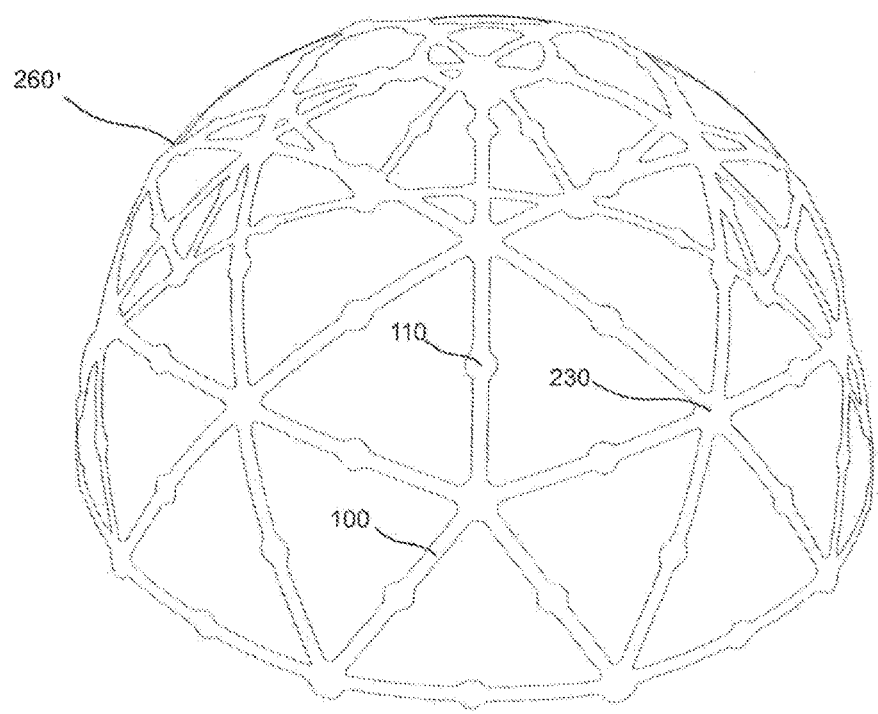
FIG. 4 is a schematic perspective view of a three-dimensional structure formed from a plurality of interconnected modular structural members.

FIG. 4 shows how multiple modular structural members, of the type described above, can be used on a larger scale to create a semi-spherical dome, 260'. In this case the overall structure, 260', comprises a number of different lengths of the embodiment shown in FIG. 1, all connected in such a manner as to create a geodesic structure, with a high powered LED located centrally of every vertex, 230. This very clearly illustrates the benefits to a number of applications as both the structure, and the electrical connection and placement of the high powered LEDs has been achieved through a single constituent unit type, which can be easily, and by automated machinery, be produced in a standard electronics factory. Furthermore, even a very large dome of the kind shown in FIG. 4 could be constructed from a collection of modules which could conveniently be stowed into a small, light, transportation case. A dome of this type can be used for reflectance transformation imaging, together with one or more cameras directed into the internal space defined within the dome. The activation of the camera and the lights individually and/or in selected sub-groups can be synchronised, by way of software control, to achieve photographs of the object in different lighting conditions, and in particular to demonstrate different textures of an object. In certain embodiments, the overall structure is configured to support a textile material or shroud arranged to prevent or limit external light entering an internal space defined by the structure.

It will be appreciated that the members, or rather a set or kit of such modular structural members, could be of different shapes, lengths and sizes, and need not necessarily be identical, for example to facilitate the creation of curved surfaces. The embodiment shown in FIG. 1, 100, is constructed from an FR-4 material which is slightly flexible due to the substrate being very thin. This makes shallow curves possible to create in the larger structure. Other embodiments could use a completely flexible substrate material such as Polyimide, or a material which comprises flexible and non-flexible areas such as FR4 with Polyimide embedded. These further embodiments would allow greater flex across the surface of the member and therefore to enabling more complex overall structures to be created.

In an alternative embodiment to that shown in FIGS. 1 and 2, the substrate is provided with a further hole in the substrate beneath the LED which allows for a heatsink to be placed on the opposite side of the substrate, where the associated electronic components, 125, with a connector portion of the heatsink extending into the hole and thermally connecting to the underside of the LED. The heatsink allows heat from the LED to efficiently escape to the surrounding air, facilitating high power operation and increased lifetime.

Figure 5:
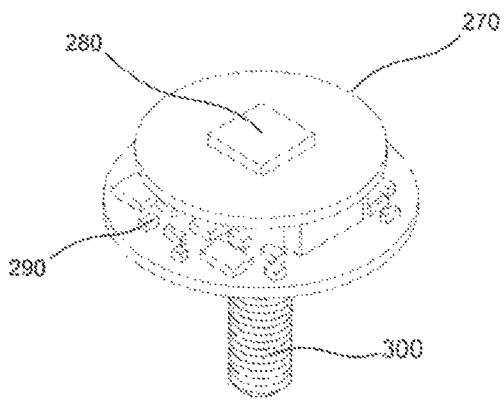
FIGS. 5 and 6 are perspective views of a modified mechanical fixing for connecting modular structural members.
Figure 6:
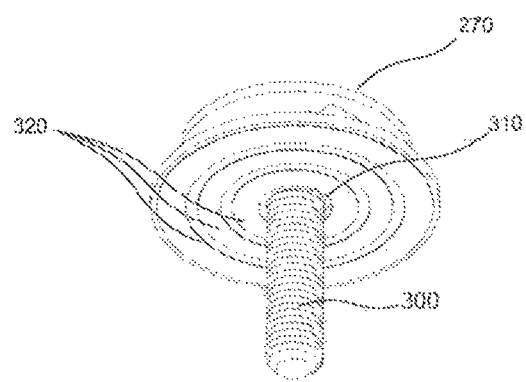
Figure 7:
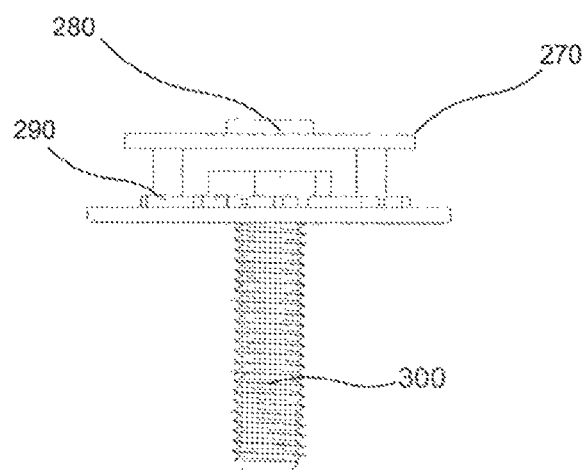
FIG. 7 is a side elevation of the fixing of FIGS. 5 and 6.

A further embodiment is shown in FIGS. 5, 6 and 7. The embodiment, 270, can be used to mount, in this case, a high powered LED, at the nodes of a larger structure. The embodiment comprises a high powered LED, 280, control electronics, 290, a single set of concentric electrically conductive rings, 320 and a hole, 310. In addition, the embodiment comprises a built-in threaded fastener, 300, which allows it to be attached to a connection point, or node, in a larger structure and serve both the purpose of an additional light device and also the mechanical fixing between two end portions. The presence of the rings 300, allows the LED 280 to be powered and/or its operation to be controlled.

Figure 8:
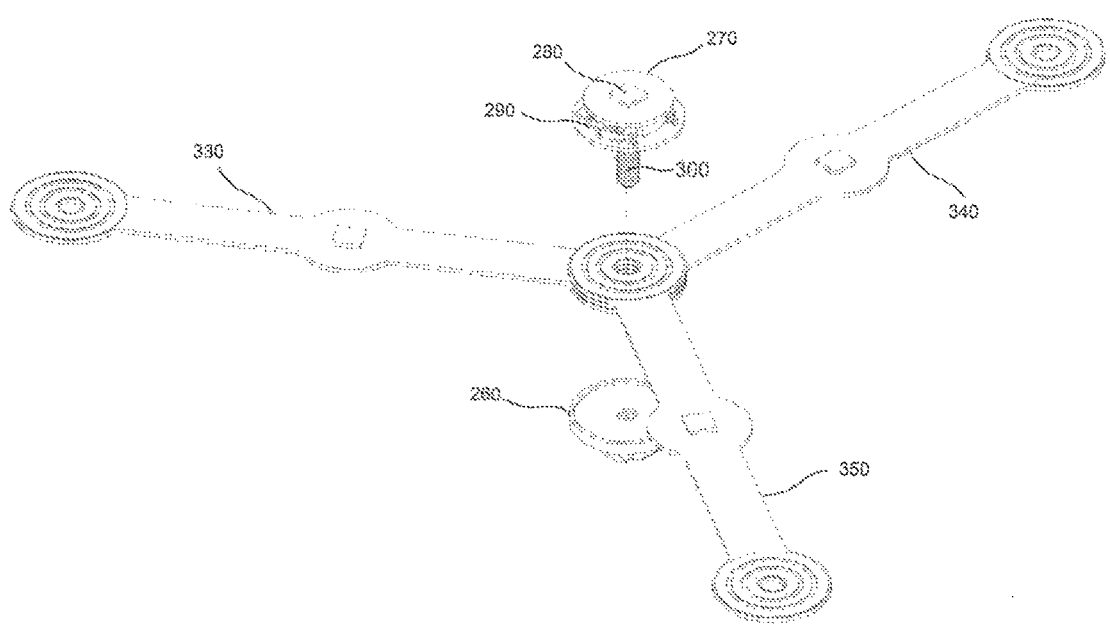
FIG. 8 is a perspective view showing multiple modular structural members being connected together using the fixing of FIGS. 5, 6 and 7.

FIG. 8 shows an example of the way in which the embodiment of FIGS. 5, 6 and 7 is used as the mechanical fixing to connect a number of modules, 330, 340, 350, together whilst also allowing an LED, 280 to be placed at the connection point itself.

Reference has been made above to the modular structural member being capable of being realised in different sizes and shapes. For example, one possible variant embodiment comprises a tri-limbed arrangement comprising three limb portions 110, each provided with an end portion 102.

What is claimed is:

1. A modular structural member comprising:
at least two connection portions, and a structural portion, the connection portions arranged to provide electrical and mechanical connection to other structural members,
wherein electronic componentry is provided on the structural portion, and the connection portions are arranged to receive a fastener, for connecting multiple connection portions together, each of the connection portions defining a substantially planar contour having first and second sets of electrical contacts exposed on opposing planar sides thereof, and
wherein a plurality of the structural members are arranged to be connected together to form a structure, with respective ones of the connection portions thereof stacked one over a top of the other and concentrically clamped together by a fastener.

2. A modular structural member as claimed in claim 1 which is arranged to be detachably connected to another member.

3. A modular structural member as claimed in claim 1 in which the electronic componentry comprises at least one of a light emitting device, a camera, a sensor and control electronics, mounted on the surface of the member.

4. A modular structural member as claimed in claim 1 in which at least one of said structural members is intermediate of the connection portions.

5. A modular structural member as claimed in claim 1 in which the electronic componentry is located in a region substantially central of the connection portions.

6. A modular structural member as claimed in claim 1 wherein said modular structural member is of overall substantially elongate form.

7. A modular structural member as claimed in claim 1 in which the electronic componentry is surface-mounted on a substrate of the member.

8. A modular structural member as claimed in claim 1 in which the connection portions are substantially planar.

9. A modular structural member as claimed in claim 8 in which the connection portions comprise at least one substantially planar connection surface.

10. A modular structural member as claimed in claim 1 including a substrate on which the electronic componentry is mounted.

11. A modular structural member as claimed in claim 10 in which the material of the substrate comprises at least one of a polymer, a plastics material and a cured resin material.

12. A modular structural member as claimed in claim 11 in which the substrate comprises a printed circuit board substrate.

13. A modular structural member as claimed in claim 1 wherein the electronic componentry has an area footprint substantially contained peripherally within a footprint extent of the underlying support surface of a substrate of a member to which the electronic componentry is attached.

14. A modular structural member as claimed in claim 1 in which at least one of the connection portions comprises at least one electrical contact, arranged to make electrical connection with a contact of a connection portion of another modular structural member.

15. A modular structural member as claimed in claim 14 which the at least one electrical contact arranged to connect power, data and/or signalling to and/or from the electronic componentry.

16. A modular structural member as claimed in claim 14 including two sets of electrical contacts, each set located on a respective connection portion, each contact being connected to a counterpart contact on an opposing side of the connection portion.

17. A modular structural member as claimed in claim 14, in which the at least one electrical contact is substantially arcuate.

18. A modular structural member as claimed in claim 17 in which the at least one electrical contact is substantially circular.

19. A modular structural member as claimed in claim 18 which comprises a plurality of concentric substantially circular electrical contacts, provided on at least one side of a connection portion of the member.

20. A modular structural member as claimed in claim 1 in which each of said connection portions is provided with a through-hole, arranged to receive a fastener therethrough to maintain the multiple connection portions in a connected condition.

21. A modular structural member as claimed in claim 20 in which the through-hole is located substantially centrally of the respective connection portion in which it is provided.

22. A modular structural member as claimed in claim 1 having structural integrity for multiple ones thereof to be connected together to form a frame structure.

23. A modular structural member as claimed in claim 22 which is substantially rigid, flexible, or a hybrid of rigid and flexible portions.

24. A modular structural member as claimed in claim 1 in which the electronic componentry arranged to be controlled by at least one of a wired connection, an air-interface connection, or is arranged to be substantially autonomously controlled.

25. A modular structural member as claimed in claim 1 in which the connection portions comprise a first end portion and a second end portion.

26. An apparatus comprising a plurality of modular structural members in claim 1, and a fastener arranged to maintain connection portions of at least some of the members in a connected condition.

27. An apparatus of claim 26, in which the fastener is arranged to clamp the connection portions together.

28. An apparatus as claimed in claim 26 in which the fastener comprises a threaded shank, and opposing clamping surfaces.

29. An apparatus as claimed in claim 26, in which the fastener is provided with electronic componentry mounted thereon.

30. An apparatus as claimed in claim 26, in which at least two of the members are of different dimensions and/or shapes and/or sizes.

31. A structure comprising a connected plurality of the modular structural members of claim 1 with at least one fastener.

32. A structure as claimed in claim 31 which comprises at least one of a semi-spherical dome shape, curved, spherical shape, cube shape, pyramid shape and/or a flat shape.

33. A structure as claimed in claim 31 in which at least two of the modular structural members comprise the light emitting devices, which are arranged to point inwardly or outwardly of the structure.

34. A structure as claimed in claim 31 which includes at least one camera arranged to allow photos to be taken of an object in the internal space defined by the structure.

35. A structure as claimed in claim 31 forming a domed frame configured to support a textile material or shroud arranged to prevent or limit external light entering an internal space defined by the structure.

* * * * *